United States Patent
Pozidis et al.

(10) Patent No.: US 6,731,699 B2
(45) Date of Patent: May 4, 2004

(54) DETECTOR, REPRODUCTION SYSTEM, RECEIVER AND METHOD

(75) Inventors: Charalampos Pozidis, Eindhoven (NL); Willem Marie Julia Marcel Coene, Eindhoven (NL); Johannes Wilhelmus Maria Bergmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 212 days.

(21) Appl. No.: 09/860,308

(22) Filed: May 18, 2001

(65) Prior Publication Data

US 2002/0021771 A1 Feb. 21, 2002

(30) Foreign Application Priority Data

May 25, 2000 (EP) .......................................... 00201876

(51) Int. Cl.[7] .......................... H04L 27/06; H03M 7/00
(52) U.S. Cl. ......................................... 375/340; 341/59
(58) Field of Search ................................ 375/340, 341, 375/316, 262; 369/59.22; 358/426; 381/FOR 103; 341/59; 704/503; 382/245

(56) References Cited

U.S. PATENT DOCUMENTS

| | | | | |
|---|---|---|---|---|
| 5,260,976 A | * | 11/1993 | Dolivo et al. | 375/341 |
| 5,729,517 A | * | 3/1998 | Fujiwara et al. | 369/59.22 |
| 5,822,143 A | * | 10/1998 | Cloke et al. | 360/65 |
| 6,111,833 A | * | 8/2000 | Nakagawa et al. | 369/59.23 |
| 6,418,096 B1 | * | 7/2002 | Kahlman et al. | 369/44.32 |

OTHER PUBLICATIONS

Nakagawa et al., "Simple detection method for RLL codes (Run detector)," IEEE transactions on Magnetics, pp. 3262–3264.*

Pozidis et al., "A low–Complexity and High–Speed Detections Method for High Density d=1 Optical recording,"Aug. 2000, IEEE transactions on Consumer Electronics, vol. 46, No. 1, pp. 562–571.*

Jan W.M. Bergmans, "Digital Baseband Transmission and Recording", Kluwer Academic Publishers, 1996, Chapter 7, pp. 301–372.

* cited by examiner

*Primary Examiner*—Tesfaldet Bocure
(74) *Attorney, Agent, or Firm*—Michael E. Belk

(57) ABSTRACT

A detector (30) is described for detecting a digital signal ($B_i^o$) out of an input information signal ($A_i$) which represents a runlength limited sequence, the runlength having a minimal value m. The detector (30) generates (60, 62) a preliminary binary signal ($B_i$) out of the input information signal ($A_i$). A composed sequence of subsequent bits is identified (86) within the preliminary binary signal ($B_i$) which subsequently includes at least a first neighboring bit of a run of length greater or equal than m+1, one or more further runs of length m and at least a second neighboring bit of a run of length greater or equal than intl. A set of sequences are generated (84, 86). These sequences can be obtained from said composed sequence by changing polarities of binary values within the composed sequence without violating the runlength constraint. The set includes the composed sequence obtained from the preliminary binary signal. A path metric (D) is calculated (94, 96) for two or more sequences of the set, said path metric (D) being the sum of the branch metrics (d) for the path through the trellis corresponding to the sequence of binary values. The sequence from the set which has the highest likelihood of corresponding to the input sequence represented by the input information signal ($A_i$) is identified (86, 98, 100) on the basis of the path metric.

17 Claims, 7 Drawing Sheets

Figure 1:
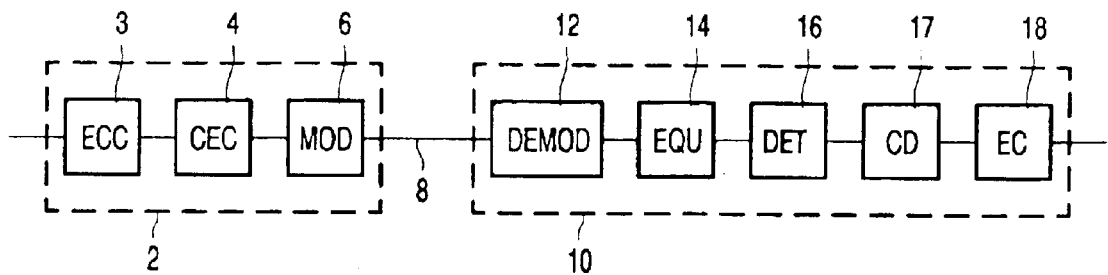

| | | | | | | | |
|---|---|---|---|---|---|---|---|
| 0 0 0 0 | 1 1 1 1 1 | 0 0 0 | 1 1 1 | 0 0 0 0 0 0 | 1 1 1 1 1 1 | 0 | FIG. 9a |
| 27 26 25 24 | 23 22 21 20 19 | 18 17 16 | 15 14 13 | 12 11 10 9 8 7 | 6 5 4 3 2 1 | 0 | FIG. 9b |
| | 5 4 3 2 1 | 3 2 1 | 3 2 1 | 6 5 4 3 2 1 | 6 5 4 3 2 1 | | FIG. 9c |
| 5 | — 3 — | — 3 — | — 6 — | — 6 — | | | FIG. 9d |
| F | — T — | — T — | — F — | — F — | | | FIG. 9e |

| | | | | |
|---|---|---|---|---|
| 1 | 0 0 0 | 1 1 1 | 0 | FIG. 10a |
| 0 | 0 0 0 | 1 1 1 | 0 | FIG. 10b |
| 0 | 0 0 1 | 1 1 1 | 0 | FIG. 10c |
| 0 | 0 0 1 | 1 1 0 | 0 | FIG. 10d |
| 1 | 0 0 0 | 1 1 1 | 1 | FIG. 10e |
| 1 | 0 0 0 | 0 1 1 | 1 | FIG. 10f |
| 1 | 1 0 0 | 0 1 1 | 1 | FIG. 10g |
| 1 | 1 0 0 | 0 1 1 | 1 | FIG. 10h |
| 1 | 1 1 1 | 1 0 0 | 0 | FIG. 10i |

DETECTOR, REPRODUCTION SYSTEM, RECEIVER AND METHOD

The invention pertains to a detector for deriving a digital signal from an input information signal which represents a runlength limited sequence, the runlength having a minimal value m.

The invention further pertains to a reproduction apparatus, for reproducing digital symbols stored on a medium, comprising the detector The invention further pertains to a receiver, for reproducing digital symbols from a received signal, comprising the detector.

The invention further pertains to a method for deriving a digital signal from an input information signal which represents a runlength limited sequence, the runlength having a minimal value m.

Optical recording methodology relies heavily on the use of runlength limited channel codes. Their purpose is a.o. to match the spectral characteristics of the user information to those of the optical recording channel. RLL codes restrict the number of consecutive like bits in the coded bit-stream, and may be characterized by two parameters, namely (d,k) with (d+1) being the minimum and (k+1) being the maximum allowed number of consecutive equal bits. Examples of such RLL codes include the EFM-code (d=2, k=10) employed in the CD, and the EFM+-code (d=2, k=10) employed in the DVD.

During the read-out of optically-recorded information, the stored bit-stream undergoes several kinds of distortion, a.o. owing to the limited resolution of the laser beam, dynamic defocusing of the read head and disc tilt. In many cases distortion is such that a simple threshold detector (TD) is not adequate to reproduce the distorted data with sufficient accuracy. This can be the case, for example, in DVD, where the recording density is significantly higher than in the CD, resulting in pits and lands of small size and thus in increased inter symbol interference (ISI) from adjacent pits and/or lands. In such situations more advanced detection techniques are necessary to achieve acceptable bit-error rates.

Several techniques have been proposed for use with RLL codes. According to a first class of techniques a bit sequence is estimated from the input signal by means of a maximum likelihood sequence detection, e.g. through the use of a Viterbi algorithm. The Viterbi algorithm is usually tailored to a fixed partial response and the resulting detector is then called a partial response maximum likelihood detector (PRML). It is normally used as a cascade to an equalizer that serves to shape the overall response of the channel and the equalizer to the fixed partial response used. This detector operates in a bit-by-bit fashion, using the received samples and its own estimates for them, in order to recover the most probable transmitted bit pattern. The Viterbi algorithm is described in more detail in "Digital Baseband Transmission and Recording", by Jan W. M. Bergmans, 1996, chapter 7, pages 301–372.

PRML-detection suffers from an operating speed bottleneck, caused by the bit recursive nature of its critical loop, which comprises at least a comparison and a selection operation. As a result of this speed limitation, application of PRML detection techniques to the high bit-rates of evolving optical recording technologies becomes increasingly problematic.

According to a second class of techniques a correcting stage is included for detecting and correcting runlength violations in a bit-sequence obtained in a first stage. The first stage may, for example, be implemented as a simple threshold detector. The second stage is known as runlength pushback detection (See for example WO 98/27681).

It is a purpose of the invention to provide a detector according to the introductory paragraph which detects a digital signal from an input information signal with an error-rate approximating that of a PRML-detector, while its computational complexity is reduced.

It is a further purpose of the invention to provide a reproduction system comprising such a detector.

It is a further purpose of the invention to provide a receiver comprising such a detector.

It is also a purpose of the invention to provide a method according to the introductory paragraph which detects a digital signal from an input information signal with an error-rate approximating that of a PRML-detector, while its computational complexity is reduced.

According to the invention a detector is provided for detecting a digital signal out of an input information signal which represents a runlength limited sequence, the runlength having a minimal value m. The detector according to the invention comprises means for generating a preliminary binary signal out of said input information signal, means for identifying a composed sequence of subsequent bits within the preliminary binary signal which subsequently comprises at least a first neighboring bit of a unipolar sequence of length greater or equal than m+1, one or more further unipolar sequences of length m and at least a second neighboring bit of a unipolar sequence of length greater or equal than m+1, a unipolar sequence being defined as a sequence of bits having the same binary value, and bordering at both sides at a bit having the opposite binary value, means for generating a set of sequences which can be obtained from said composed sequence by changing polarities of binary values within said composed sequence without violating the runlength constraint, the set comprising the composed sequence obtained from the preliminary binary signal, means for calculating a path metric for two or more sequences of said set, said path metric being the sum of the branch metrics for the path through the trellis corresponding to said sequence of binary values, means for identifying the sequence from said set which has the highest likelihood of correspondence to the input sequence represented by the input information signal on the basis of the path metric.

In the detector according to the invention the computation of the likelihood is restricted to unipolar sequences (runs) or sequences of runs having a minimal runlength.

The invention is based on the insight that on the one hand the runs having a minimal runlength are most prone to detection errors as they have the highest frequency. On the other hand the path through the trellis that is based on the preliminary binary signal already has a relatively high likelihood of correspondence to the input sequence represented by the input information signal. Hence it suffices to consider only the set of possible sequences comprising the composed sequence obtained from the preliminary binary signal and those sequences which can be derived from said composed sequence with relatively few variations. Hence the number of calculations for estimating the optimal path is significantly reduced in comparison to the recursive calculations required in a PRML-detector. Hence, in the detector of the invention the computational power is used efficiently in that a relatively high number of errors is detected with a relatively small number of computations.

A preferred embodiment of the invention according to claim 2 is based on the observation by the inventors that the boundaries between subsequent unipolar sequences usually do not shift more than one sample with respect to each other.

A preferred embodiment of the invention according to claim 3 has the advantage that unlikely modifications of the composed sequence are left out of consideration. This further reduces the computational complexity while maintaining a good detection performance.

A further preferred embodiment is claimed in claim 4. It has been observed that often the boundaries between runs in the signal tend to shift in only one direction. In those cases it is therefore sufficient to evaluate only those variations of the composed sequence. This also reduces the computational complexity while maintaining a good detection performance.

The invention is in particular applicable to a reproduction system. In a reproduction system according to the invention for reproducing digital symbols stored on a medium, said reproduction system comprising read out means which include means for projecting a first optical beam along an optical axis at a scanning spot at the medium and for generating an input information signal representing the digital symbols stored on the medium, by measuring an intensity of an optical beam returned from the scanning spot, said reproduction system further comprising movement means for causing a relative movement in a movement direction between the scanning spot and the medium, said reproduction system further comprising a detector according to claim 1, 2, 3 or 4 for deriving a digital signal from said input information signal.

A preferred embodiment of the reproduction system according to the invention is described in claim 6. The tilt measurement enables the signal detector to predict the kind of distortion which occurs in the signal. This can be used to restrict the possible modifications in the composed sequence to those which have the highest likelihood.

The tilt detection means may be implemented in several ways. For example by a separate sensor, which measures a deviation of the position of the beam reflected from the record carrier. Preferably, however, the tilt detection means derive a tilt signal from the signal read from the record carrier. In that way a separate sensor is superfluous. Such tilt detection means are described for example in the earlier filed application WO 00/10165-A1. A practical embodiment of such detection means is claimed in claim 7.

The invention is in particular suitable for application with a channel code which apart from the runlength constraint also has a repeated minimum transition runlength (RMTR). The latter prescribes the maximum allowed number of concatenated unipolar sequences of minimum length. Such a code is described for example in WO 99/63671-A1. If the channel code has a low value for RMTR also the hardware requirements for the detector are modest, and relatively few variations of the composed sequence have to be computed. EFM+ has a RMTR of 15. The channel codes 17PP and EFMCC, both designed for DVR, have a RMTR of 6.

The invention also pertains to a receiver for reproducing a sequence of output symbols from a received signal, the receiver comprising a detector according to the invention which is coupled to a demodulator for demodulating the received signal.

Preferably the detector is coupled to the demodulator via an equalizer.

The invention also pertains to a method for detecting a digital signal out of an input information signal which represents a runlength limited sequence, the runlength having a minimal value m. The method according to the invention comprises the steps of generating a binary signal out of said input information signal, identifying a composed sequence of subsequent bits within the binary signal which subsequently comprises at least a first neighboring bit of a unipolar sequence of length greater or equal than m+1, one or more further unipolar sequences of length m and at least a second neighboring bit of a unipolar sequence of length greater or equal than m+1, a unipolar sequence being defined as a sequence of bits having the same binary value, and bordering at both sides at a bit having the opposite binary value, generating a set of sequences which can be obtained from said composed sequence by changing polarities of binary values within said composed sequence without violating the runlength constraint, the set comprising the composed sequence calculating a path metric for two or more sequences of said set, said path metric being the sum of the branch metrics for the path through the trellis corresponding to said sequence of binary values, identifying the sequence from said set which has the highest likelihood of correspondence to the input sequence represented by the input information signal on the basis of the path metric.

Figure 2:
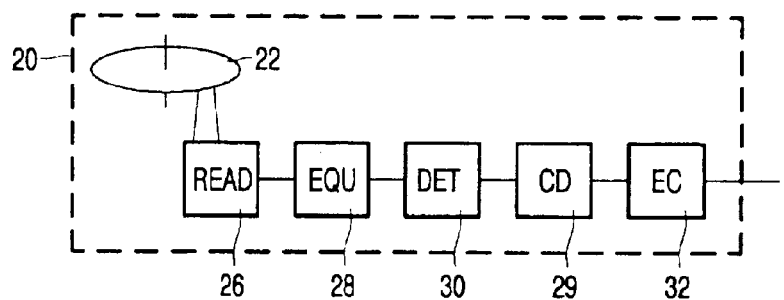
Figure 4:
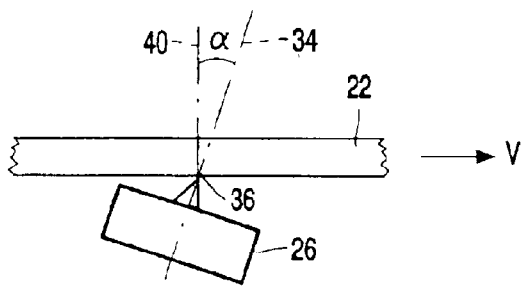
Figure 3:
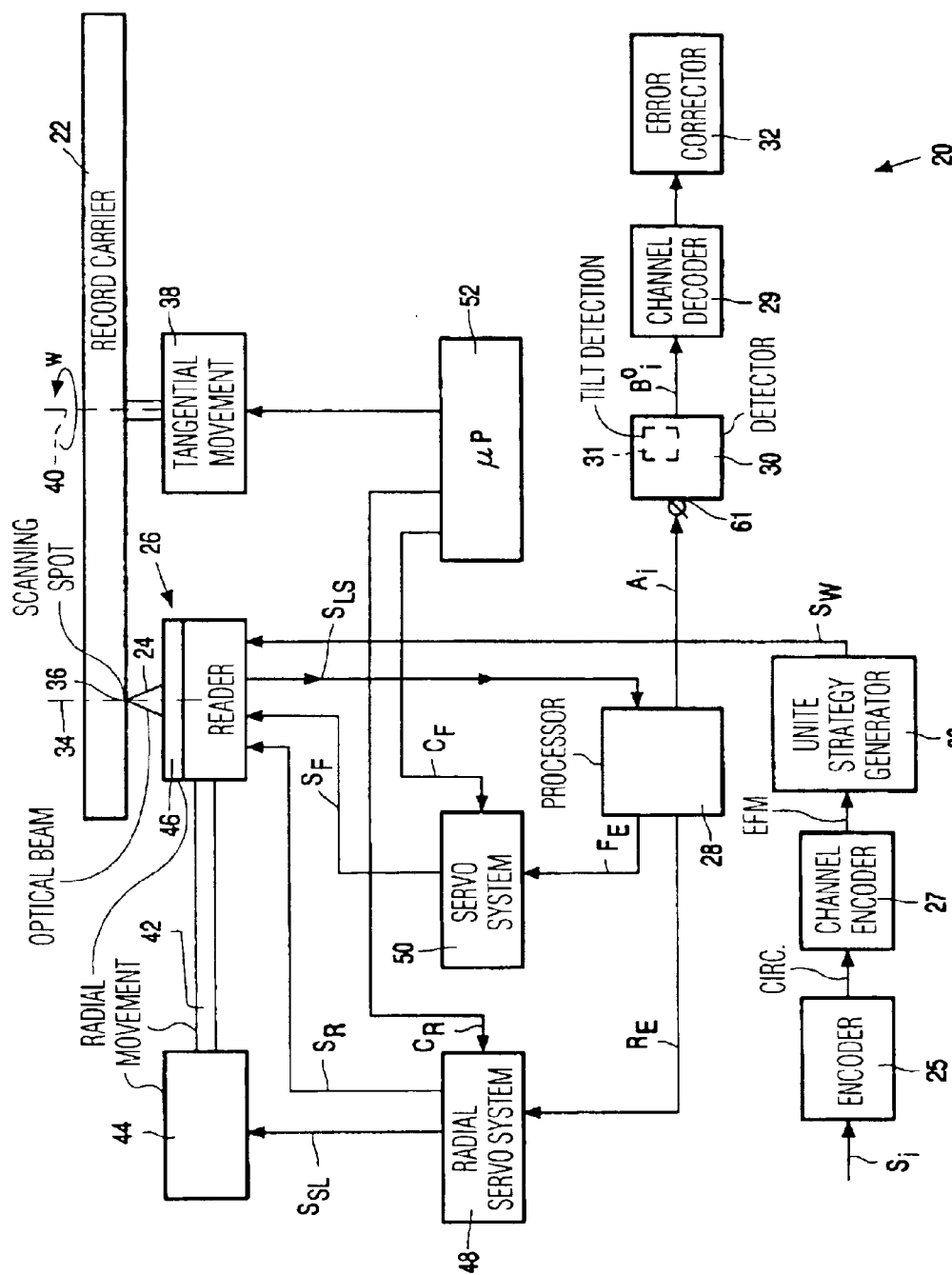
Figure 5:
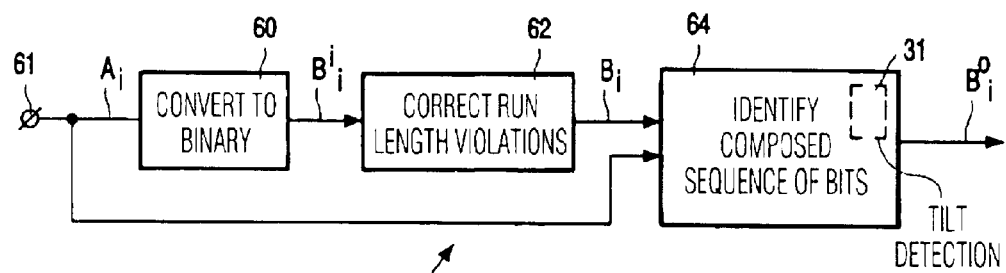
Figure 6:
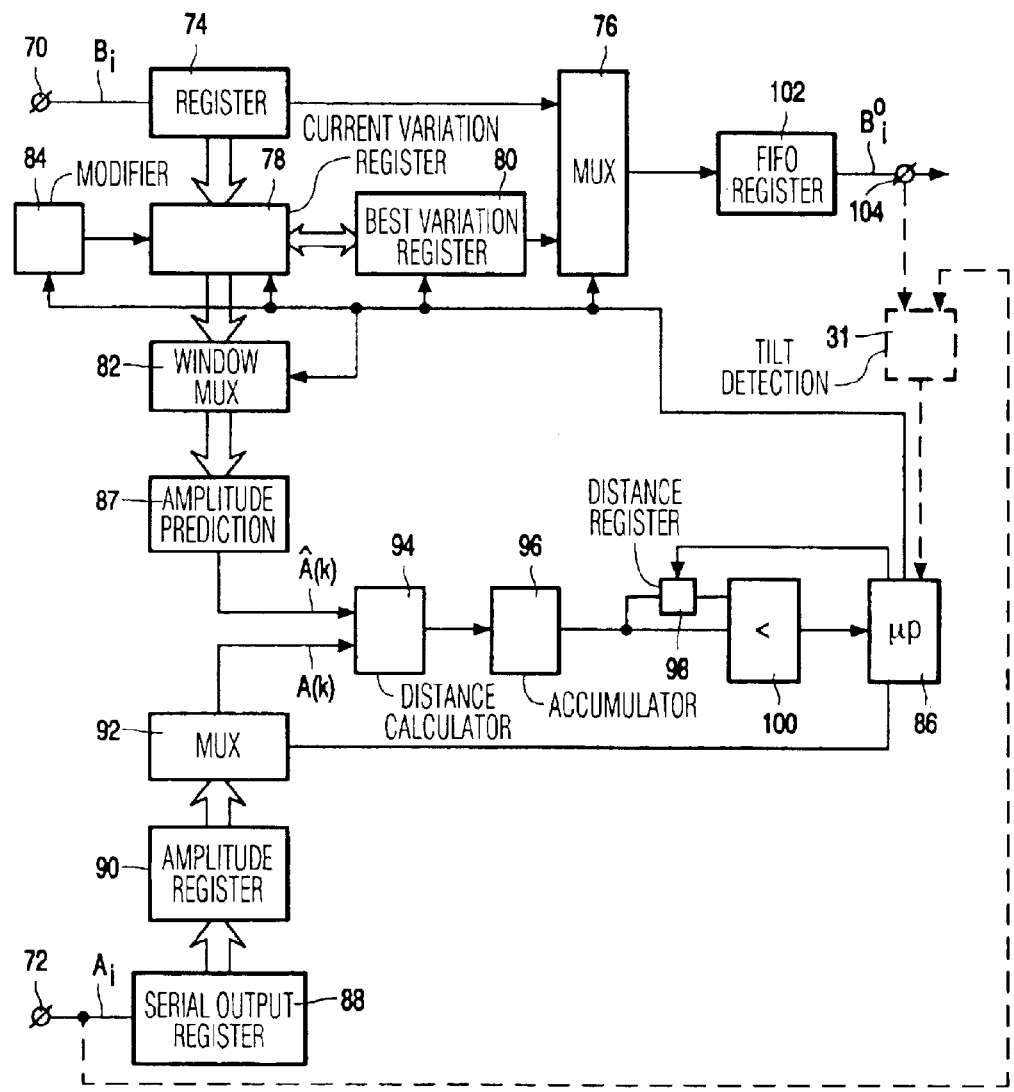
Figure 7:
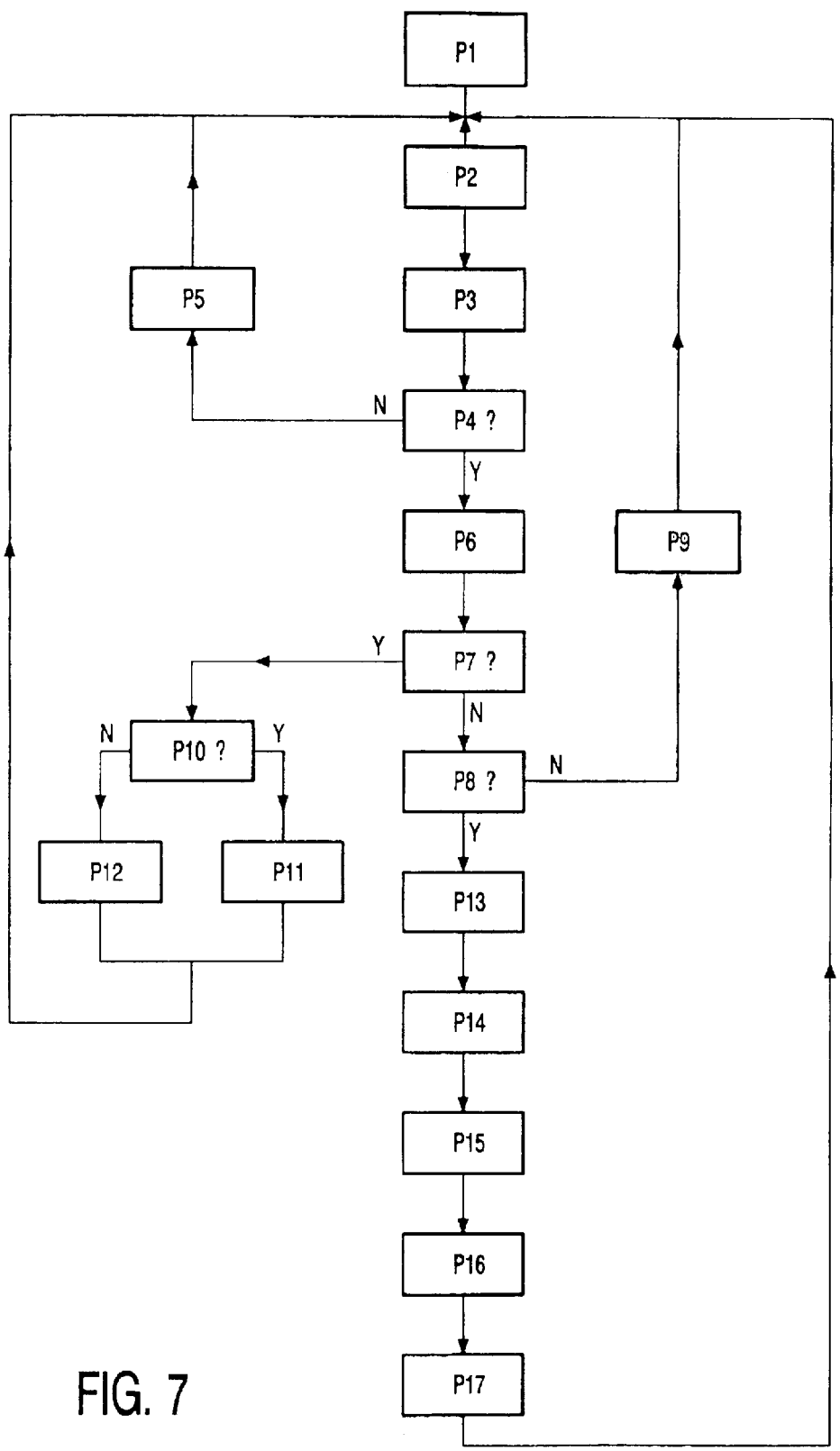
Figure 8:
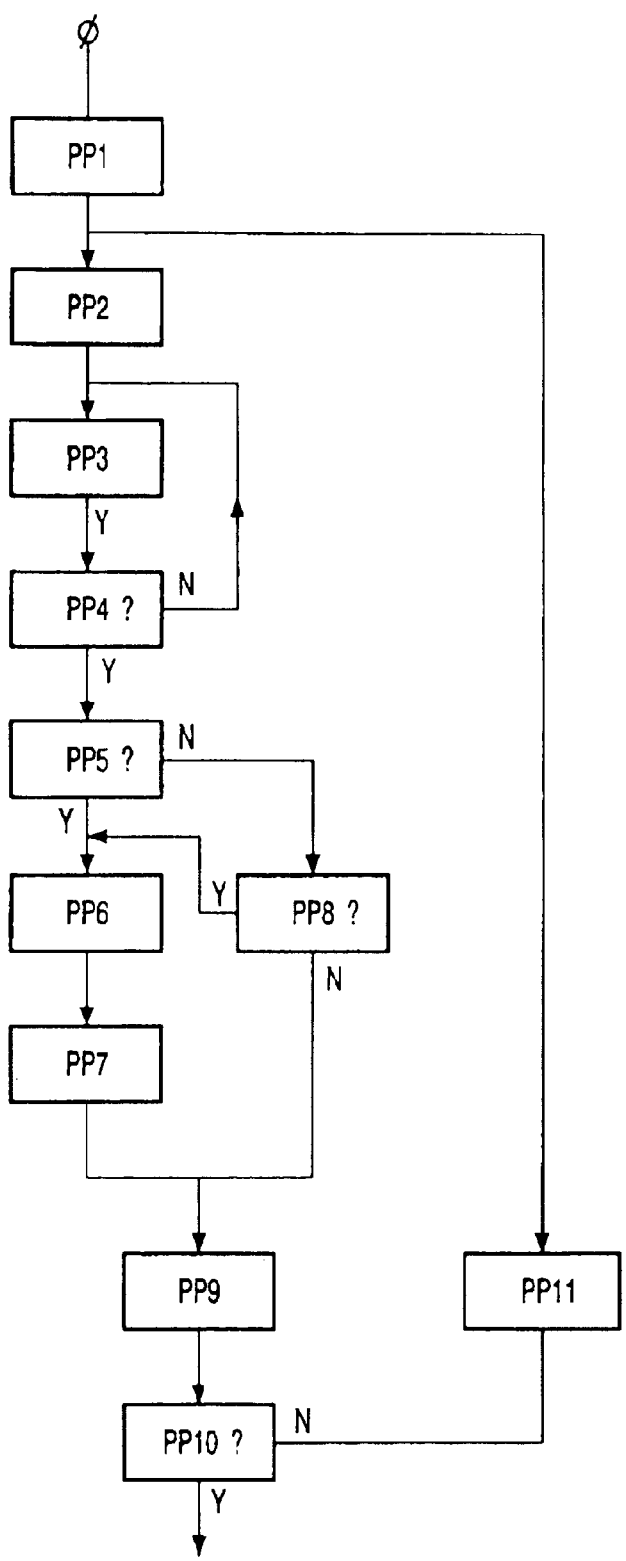
Figure 11:
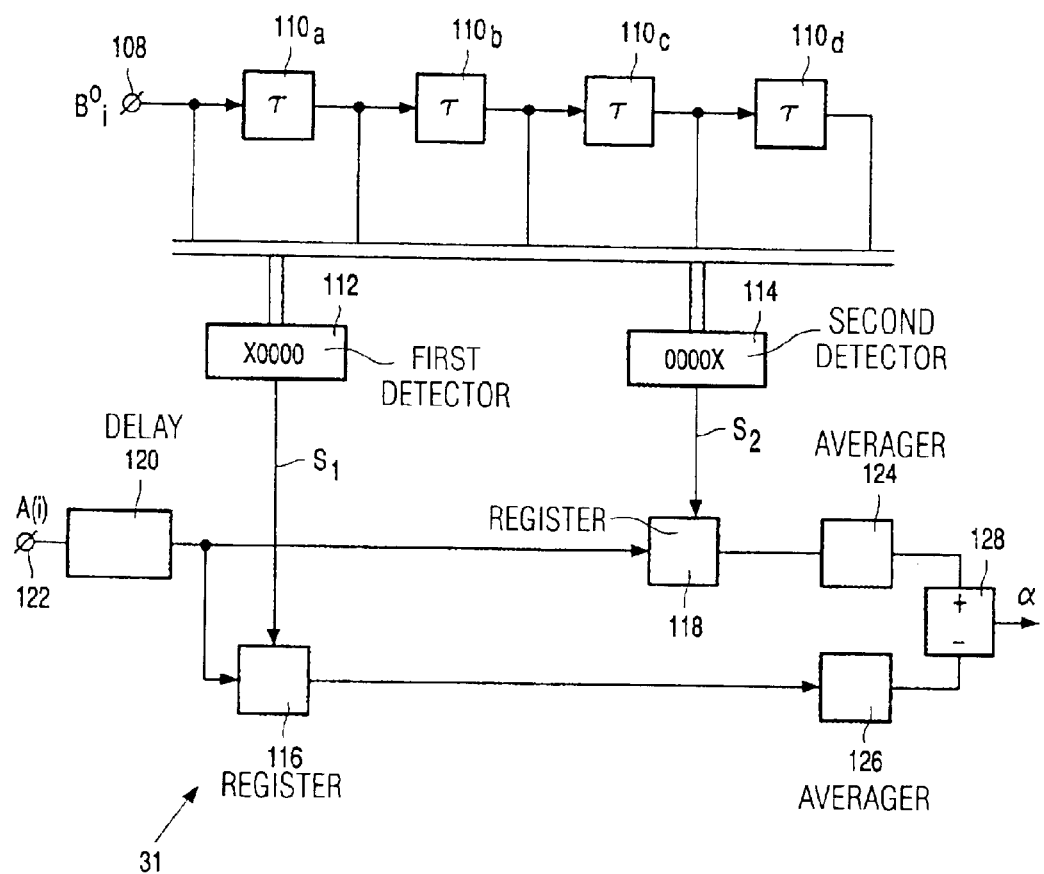

These and other aspects of the invention are described with reference to the drawing. Therein FIG. 1 shows a transmission system in which the present invention can be used, FIG. 2 shows a reproduction system in which the present invention can be used, FIG. 3 shows the reproduction system of FIG. 2 in more detail, FIG. 4 shows a view of a portion of the reproduction system of FIG. 3, according to IV in FIG. 3, FIG. 5 schematically shows a detector according to the invention for deriving a digital signal, FIG. 6 shows a unit of the detector in more detail, FIG. 7 shows a flowchart explaining the operation of the unit of FIG. 6, FIG. 8 shows a portion of the flowchart of FIG. 7 in more detail, FIG. 9 shows an example of an input signal, and some variables in the program corresponding to the flowchart of FIG. 7, FIG. 10 shows an example of a composed sequence within the input signal and possible variations, FIG. 11 shows an embodiment for a tilt detector in an implementation of the unit shown in FIG. 6.

In the transmission system according to FIG. 1, a digital signal to be transmitted is applied to a first encoder 3 in a transmitter 2. The output of the first encoder 3 is connected via a second encoder 4 to an input of a modulator 6. The output of the modulator 6 constitutes the output of the transmitter 2. The output of the transmitter 2 is connected via a transmission medium 8 to an input of a receiver 10. The received signal is applied to an input of a demodulator 12. The output of the demodulator is connected to an input of an equalizer 14. The output of the equalizer 14 is connected to an input of a detector 16. The output of the detector is connected to a first decoder 17. The output of the first decoder 17 on its turn is coupled to a second decoder 18. The output of the second decoder 18 constitutes the output of the receiver 10.

In the first encoder 3, the digital symbols to be transmitted are converted into redundant symbols by using an error correcting code. This can e.g. be a convolutional code or a block code such as a Reed-Solomon code. It is also conceivable that a so-called concatenated coding scheme is used.

The second encoder 4 converts the redundant symbols, obtained from the first encoder 3, into channel symbols, by means of a channel code suitable for transmission via the transmission medium 8.

The channel symbols of the second encoder 4 are modulated on a carrier by the modulator 6. Possible modulation methods are e.g. QPSK, QAM or OFDM.

The modulated signal is transmitted via the transmission medium 8 to the receiver 10. In the receiver 10, the received signal is demodulated by the demodulator 12. The demodulated signal is filtered by an equalizer 14 to eliminate inter symbol interference caused by the limited bandwidth of the transmission medium. The detector 16 derives the transmitted channel symbols from the equalized signal at the output of the equalizer 14. In the first decoder 17 the transmitted channel symbols are converted into intermediate symbols. The latter are converted into output symbols by the second decoder 18. The second decoder 18 provides for error detection and correction. The output of the second decoder 18 also constitutes the output of the receiver.

In the reproduction system 20 according to FIG. 2, a record carrier, here an optical disc 22 is read out by read unit 26. It is assumed that the data written on the optical disc 22 is coded according to the 8–14 EFM coding scheme as is used in the Compact disc standard. However, the present invention is also applicable to the 8–16 EFM+ coding scheme as adopted in the DVD (Digital Video Disc) standard. The EFM code has a minimum runlength m (the distance between subsequent bits having a same value that are separated by a sequence of bits having the inverse value) of 3, and a maximum runlength of 11. The EFM+ code also has a minimum runlength m of 3 and a maximum runlength of 11. In another embodiment the disc is a DVR-ROM disc, which is coded according to the EFM-CC coding scheme, also having a minimum runlength m of 3 and a maximum runlength of 11. The EFM-CC coding scheme is described in PH-NL 000074. The disc may otherwise be a DVR-RW disc having a coding scheme 17PP with a minimum runlength m of 2 and a maximum runlength of 8. In again another embodiment the disc is of a magnetic, or an opto-magnetic type.

The output of the read unit 26 is filtered by an equalizer 28 to eliminate undesired inter symbol interference. The output signal of the equalizer 28 is used by the detector 30 to obtain the sequence of detected channel symbols. The operation of the detector 30 will be described later in more detail. The detected channel symbols are received by a channel decoder 29 which converts the channel symbols into intermediate symbols. The intermediate symbols are converted by an error corrector 32 which substantially reduces the bit error rate. The output of the error corrector constitutes the output of the reproduction system 20.

The record carrier need not be disc shaped, but may otherwise be in the form of a card.

An embodiment of a reproduction system 20 according to the invention for reproducing digital symbols stored on a medium 22 (here an optical disc) is described in more detail with reference to FIG. 3. The reproduction system 20 comprises read means 26 which include a unit (not shown) for projecting a first optical beam 24 along an optical axis 34 at a scanning spot 36 at the medium 22 and for generating an input information signal $S_{LS}$ representing the digital symbols stored on the medium 22, by measuring an intensity of an optical beam returned from the scanning spot 36. The reproduction system 20 further comprises movement means for causing a relative movement in a movement direction between the scanning spot 36 and the medium 22. The movement means comprises radial movement means 42, 44, 46 and tangential movement means 38. The tangential movement means are in the form of a motor 38 which rotates the disc 22 around an axis 40. The radial movement means comprise a slide 42, which is driven by a slide motor 44. The radial movement means 42, 44, 46 further comprise a radial transducer 46. The radial movement means 42, 44, 46 are controlled by a radial servo system 48 by means of signals $S_{SL}$ and $S_R$. In a reproduction system for a record carrier in the form of a card the movement means may for example comprise a first and a second linear motor for moving the card and the scanning spot with respect to each other in two mutually orthogonal directions. The read means 26 also comprises a focus actuator (not shown) for maintaining a well focussed scanning spot 36. The focus actuator is controlled by servo system 50. The motor 38, and the servo systems 48 and 50 are controlled by microprocessor 52.

The reproduction system 20 comprises a signal processing unit 28, which includes an equalizer for generating an input information signal $A_i$, for the detection unit 30. The signal processing unit also provides a radial error signal $R_E$ and a focus error signal $F_E$ for the servo system 50.

The reproduction system 20 further comprises a detector 30 according to the invention for deriving a digital signal B $$\frac{o}{i}$$

from said input information signal $A_i$.

As shown exaggerated in FIG. 4 a tangential tilt α may occur between the optical axis 34 and a normal vector, which is in this case parallel to the rotation axis 40, of the medium with respect to the movement direction v.

The reproduction system comprises tilt detection means 31 for generating a tilt signal which is indicative for the polarity of the tilt α, and means for restricting the set of sequences for which the path metric is determined on the basis of the tilt signal.

An output of the detector 30 is coupled to an error corrector 32 for substantially reducing the bit error rate.

The system shown in FIG. 3 is also suitable for recording an information signal Si at the record carrier 22. To that end the system comprises an encoder 25 for encoding the signal by means of a code enabling error correction, e.g. a code according to the CIRC method. Au output of the encoder 25 is coupled to a channel encoder 27, for encoding the output signal of the encoder 25 in a channel code, e.g. EFM. The output of the channel encoder 27 in its turn is coupled to a write strategy generator 33 which generates a pulsed write signal for controlling a radiation source which is used to generate a beam to write the record carrier. The radiation source may be the same which is used for scanning the record carrier 22.

The tilt detection means 31 may be implemented in several ways. For example by a separate sensor, which measures a deviation of the position of the beam reflected from the record carrier. Preferably however, the tilt detection means derive a tilt signal from the signal read from the record carrier. In that way a separate sensor is superfluous. Such tilt detection means are described for example in the earlier filed application WO 00/10165-A1. In the embodiment shown the tilt detection means 31 form part of the detector 30.

An embodiment of the detector according to the invention is described with reference to FIG. 5. The detector 30 according to the invention comprises a first circuit 60 coupled to an input terminal 61 for converting the input signal $A_i$, into an intermediary binary signal $B_i^i$. The first circuit 60 is for example a threshold detector. The detector 30 comprises a second circuit 62 which corrects the intermediary binary signal $B_i^i$ for runlength violations and therewith generates a preliminary binary signal $B_i$. Such a circuit, also called a runlength pushback detector, is for example described in WO98/27681.

The detector 30 according to the invention also comprises a third circuit 64. This circuit 64 identifies composed sequences of subsequent bits within the preliminary binary signal $B_i$ which subsequently comprise a first neighboring bit of a unipolar sequence of length greater or equal than m+1, one or more further unipolar sequences of length m and a second neighboring bit of a unipolar sequence of length greater or equal than m+1. A unipolar sequence is defined as a sequence of bits having the same binary value, and which sequence borders at both sides at a bit having the opposite binary value.

When the circuit 64 has identified such a composed sequence within the preliminary binary signal $B_i$, the circuit identifies a set of sequences which can be obtained from said composed sequence by changing polarities of binary values within said composed sequence without violating the runlength constraint. The set comprises the composed sequence. The circuit 64 calculates a path metric for two or more sequences of said set. Said path metric is the sum of the branch metrics for the path through the trellis corresponding to said sequence of binary values. The circuit 64 identifies the sequence from said set which has the highest likelihood of correspondence to the input sequence represented by the input information signal $A_i$ on the basis of the path metric.

FIG. 6 shows the third circuit 64 in more detail. The third circuit has a first input 70 for receiving the preliminary binary signal $B_i$ and a second input 72 for receiving the input information signal $A_i$. The first input 70 is coupled to a first register 74 which has a serial output coupled to a first input of a multiplexer 76 and a parallel output coupled to a current variation register 78. The signal received at the input of the first register 74 is delivered to its serial output on a first in first out basis. The current variation register 78 is coupled via a first parallel connection to a best variation register 80. The best variation register 80 has a serial output which is coupled to a second input of the multiplexer 76. The current variation register 78 is coupled via a second parallel connection to a window multiplexer 82. This multiplexer 82 selects a subsequence of bits from the sequence stored in the current variation register 78. The window multiplexer 82 selects a subsequence which is located within a window around an index k. The third circuit 64 comprises a modifier 84 coupled to the current variation register 78. Upon instruction by a microprocessor 86 the modifier 84 generates variations of the composed sequence identified within the preliminary binary signal $B_i$ by changing polarities of binary values within said composed sequence without violating the runlength constraint. The third circuit 64 further comprises an amplitude predicting unit 87 which is coupled to the window multiplexer 82. The amplitude predicting unit 87 calculates an expected amplitude $\hat{A}_k$ corresponding to each bit in the sequence on the basis of the window around said bit which is selected by the window multiplexer 82. The amplitude predicting unit 87 may be implemented in several ways. In a first embodiment the amplitude predicting unit 87 calculates the predicted amplitude $\hat{A}_k$, from a convolution of the sequence of bits $b_k$ selected by the window with an estimated response function $\hat{P}_l$ of the read channel and the equalizer i.e.:

$$\hat{A}_k = \sum_{l=-L}^{l=L} b_{k-l} \hat{P}_l$$

Otherwise the predicted amplitude $\hat{A}_k$ for a particular sequence of bits may be obtained by averaging the amplitude values $A_i$ occurring at the input channel and corresponding to each occurrence of said particular sequence of bits. Such a method is described in WO 00/12872-A1.

The third circuit is provided with a serial in parallel out register 88 which has an input coupled to the input 72 an output coupled to the amplitude register 90. The amplitude register 90 is coupled to a further multiplexer 92 which selects amplitude $A_k$ within the amplitude register upon instruction by the microprocessor 86. A distance calculator 94 calculates a distance $d_k$ on the basis of the predicted amplitude $\hat{A}_k$ and the amplitude $A_k$ received via the second input 72. The distance $d_k$ corresponds to a path metric. The distance is accumulated by accumulator 96 so as to obtain the path metric D, which is the sum of the branch metrics for the path through the trellis corresponding to the sequence of binary values currently being stored in the current variation register 78.

The third circuit comprises a minimum distance register 98 which contains a minimum distance Dmin calculated for the composed sequence and its variations. The minimum distance Dmin is compared with the distance D by a comparator 100.

The third circuit 64 has a first in first out register 102 for providing a final binary signal $B_i^o$ to output 104. The input of this register 102 is coupled to the multiplexer 76.

The operation of the device is described with reference to the flowcharts shown in FIGS. 7 and 8.

The flowchart in FIG. 7 shows the program elements P1 to P17. These program elements have the following function.

P1: The program is started and a number of variables is initialized. The value Imin is initialized to F, indicating that the previous run is not a run of minimal length. The index i for the samples of the input signal is set to 0. The counter j for counting the number of samples within a run of constant polarity is set to 0.

P2: The index i is incremented with 1.

P3: The amplitude $A_i$ of the next sample is read into register 88 and the corresponding value of the preliminary binary signal $B_i$ is read into register 74.

P4: It is verified whether the value $B_i$ of the preliminary binary signal is the start of a new run, i.e. whether the value $B_i$ is opposite to the value $B_{i-1}$ corresponding to the previous sample $A_{i-1}$.

P5: The counter j for counting the number of samples within a run of constant polarity is increased by 1.

P6: A variable r for indicating the length of a run is set equal to the counter j. The counter j is reset to 0.

P7: It is checked whether the length r of the last identified run is equal to the minimum allowed runlength m.

P8: It is checked whether the flag Imin is T indicating whether the last identified run was preceded by one or more runs of minimum allowed runlength m.

P9: The values $B_{i-r-1}$ until $B_{i-2}$ stored in register 74 are transferred to the FIFO-register 102.

P10: It is checked whether the flag Imin is F.

P11: The flag Imin is set T and a variable t, for indicating the number of bits in a train is set to minimum allowed runlength m. A train is defined as a set of mutually consecutive binary values in the preliminary binary signal $B_i$ comprising exclusively runs of minimum allowed runlength m.

P12: The variable t is increased with m.
P13: The flag Imin is set F.
P14: The input values of samples i-t-r-1 to i-r are loaded from serial in parallel out register 88 into the amplitude register 90.
P15: The values of the preliminary binary signal corresponding to the samples i-t-r-1 to i-r are loaded from the register 74 into the current variation register 78.
P16: A sequence of binary values is calculated which results in the lowest distance measure.
P17: The binary values corresponding to samples i-t-r-1 to i-r are transferred from the best variation register 80 to the FIFO-register 102.

Program element P16 is worked out in more detail in FIG. 8. The program element P16 comprises the following steps.

PP1: A counter M for counting the number of variations is initialized at 0.
PP2: The value D for the distance measure corresponding to a variation is initialized at 0. The index k into the current variation register 78 and the amplitude register 90 is set to 0.
PP3: A distance d is calculated from the amplitude $A_k$ stored into the amplitude register 90 and the amplitude $\hat{A}_k$ predicted from the values in a window around index k in the current variation register 78. The value D of the distance measure is increased with d. The index k is increased with 1.
PP4: It is checked whether k is equal to t+2.
PP5: It is checked whether M is equal to 0.
PP6: The minimal distance Dmin is set equal to D.
PP7: The content of the current variation register 78 is loaded into the best variation register 80.
PP8: It is checked whether the distance D calculated by the accumulator 96 is smaller than the minimal distance Dmin stored in the register 98.
PP9: The variation number M is incremented with 1.
PP10: It is checked whether the variation number M is equal to the total number of possible variations Mtot.
PP11: The modifier 84 calculates the next variation of the sequence of binary values in the current variation register 78.

The operation of the program illustrated in FIGS. 7 and 8 is further explained with reference to FIG. 9. Therein FIG. 9a shows an example of a preliminary binary signal $B_i$. By way of example it is supposed that the preliminary binary signal $B_i$ has a minimum allowed runlength m=3. After the variables Imin (FIG. 9e), i (FIG. 9b), and j (FIG. 9c) have been initialized at the start P1 of the program, the index i is incremented with 1 in P2. Subsequently in P3 the amplitude $A_i$ is read into the serial in parallel out register 88. Likewise the preliminary binary value $B_i$ assigned thereto by the first 60 and the second circuit 62 is read into the serial in parallel out register 74. In step P4 it is determined that a new run has started, as the preliminary binary value $B_1$ has a polarity opposite to its predecessor $B_0$. Consequently the program continues with P6. Therein the length r (shown in FIG. 9d) of the last identified run is set equal to the counter j (FIG. 9b). Subsequently the counter j is reset to 0. In P7 it is determined that the length r=0 of the last identified run is not equal to the minimum allowed runlength m. In P8 it is determined that the flag Imin is F and the program continues with P9. As the register 74 does not contain binary values corresponding to the range of indexes i-r-2 to i-2 yet, said program element P9 has no effect and the program continues with P2. In P2 the index i is increased with one and in P3 the next values for $A_i$ and $B_i$ are read into the respective registers. In P4 it is now determined that no new run has started. The program then continues with P5 so that the counter j is increased with 1. The program now repeats the loop P2-P3-P4-P5 until $A_7$ and the corresponding preliminary binary value $B_7$ have been read into their respective registers 88 and 74. It is then determined in step P4 that a new run has started. Consequently the program continues with P6. Therein the runlength r of the last identified run is set to j, which is 6 in this case, and the value of j is reset to 0. In P7 it is subsequently determined that the runlength r is not equal to the minimum allowed runlength m. The program then continues with P8, where it is determined that the flag Imin is F. Now in P9 the preliminary binary values $B_i$ with i=0 to 5 are transferred from the register 74 to the FIFO register 102 via the multiplexer 76. Subsequently the program continues with the loop P2-P3-P4-P5, reading the amplitude values $A_i$ and the preliminary binary values $B_i$ with index i=8 until 13. After the values $A_i$ and $B_i$ with index i=13 are read in the program steps P4-P6-P7-P8-P9 are executed again, having the result that the preliminary binary values $B_i$ with index i=6 to 11 are transferred to the FIFO-register 102. Now the loop P2-P3-P4-P5 is followed. After the values $A_i$ and $B_i$ with index 16 have been read in it is determined in P4 that a new run is started. In P6 the length r of the last identified run is set equal to j, being 3 in this case, and j is reset to 0. Now in P7 it is determined that the length r corresponds to the minimum allowed runlength m. In P10 it is determined that the flag Imin is F. Next in P11 the flag Imin is set T and the length t, is set equal to m. The program then continues with the loop P2-P3-P4-P5 until sample 19 has been received. The program the continues with P4-P6-P7-P10. In P10 it is determined that the flag Imin is T, which has the result that P12 is executed. Therein t is increased with m. The counter t then has the value 6. The program now continues with the loop P2-P3-P4-P5 until sample 24 has been received. Then P4, P6, P7 is executed. In P7 it determined that the length r of the last identified run is not equal to m. Hence the program continues with P8, where it is determined that Imin is T. Then in P13 the flag Imin is reset to F. In P14 the amplitude values A, with index i-t-r-1 to i-r are transferred from the serial in parallel out register 88 to the amplitude register 90. In P15 the corresponding preliminary binary values $B_i$ are transferred from the register 74 to the current variation register 78. This sequence of preliminary binary values $B_i$ forms a composed sequence of subsequent bits within the binary signal which subsequently comprises a first bit of a unipolar sequence of length greater or equal than m+1, one or more further unipolar sequences of length m and a second bit of a unipolar sequence of length greater or equal than m+1. Subsequently in P16 a set of sequences is obtained from said composed sequence by changing polarities of binary values within said composed sequence without violating the runlength constraint. This set comprises the composed sequence. In P16 it is also determined which sequence of this set has the highest likelihood of correspondence to the amplitude values $A_i$ transferred to the amplitude register 90. This sequence is transferred to the best variation register 80. P16 is explained in more detail below. After completion of P16, P17 is executed, wherein the sequence stored in the best variation register 80 is transferred to the FIFO 102. The program then continues to read in new samples with the loop P2-P3-P4-P5. Of course several portions of the program may be executed in parallel, for example the reading in of samples in said loop and the execution of P16.

The execution of P16 is explained with reference to FIG. 8 and FIG. 10. In FIG. 10a the sequence of values B(i), with i=12 until 19 is shown, which in the example above is loaded into the current variation register 78. FIGS. 10b to 10g show 6 variations of this sequence which are possible without violating the runlength constraint.

The sequence of preliminary binary values $B_i$ shown in FIG. 10a forms a composed sequence of subsequent bits within the binary signal which subsequently comprises a first bit of a unipolar sequence of length 5, which is greater or equal than m+1, two unipolar sequences of length m (3) and a second bit of a unipolar sequence of length 6, being greater or equal than m+1. In PP1 the variation number M is set to 0. This number corresponds to the composed sequence read from the preliminary binary signal $B_i$. In PP2 the distance D is initialized to 0. Also an index k for the amplitude register 90 and the current variation register 78 is initialized to 0. Next, in PP3, a distance D, which is related to the likelihood that the sequence in the current variation register 78 corresponds to the sequence of amplitudes $A_i$ in the amplitude register 90 is calculated. The larger the distance D, the smaller the likelihood of correspondence. The distance measure is for example $$D = \Sigma d_k,$$

wherein $$d_k = ABS(\hat{A}_k - A_k)(L1\text{-norm})$$

wherein $\hat{A}_k$ is the expected amplitude calculated on the basis of one or more binary values within a window around index k in the sequence of binary values in the current variation register 78. For that purpose the composed sequence loaded into the current variation register 78 may be extended at one or more sides by a plurality of binary values derived from the preliminary binary signal $B_i$, the plurality being dependent on the size of the window selected by the window multiplexer 82.

Another distance measure is $$d_k = (\hat{A}_k - A_k)^2 (L2\text{-norm})$$

In the loop PP2-PP3-PP4 the distance D corresponding to a particular path is calculated. In the embodiment shown the amplitude values $A_k$ are selected from the amplitude register 90 by means of the multiplexer 92. The binary values from which the amplitude $\hat{A}_k$ is predicted are selected by means of the window multiplexer 82. The window multiplexer 82 and the multiplexer 92 are controlled by the microprocessor 86. The summation of PP3 is performed by accumulator 96. In PP5 it is determined whether the variation number M is 0, i.e. whether the sequence stored in the current variation register 78 is the original sequence read in from the preliminary binary signal $B_i$. This is the case the first time that the test PP5 is performed. Then, in PP6, the minimal distance Dmin stored in register 98 is initialized at the distance D, and in PP7 the composed sequence is copied from the current variation register 78 to the best variation register 80. Subsequently in PP9 the variation number M is incremented with 1. In PP10 it is checked whether the variation number M equals the total number Mtot of variations. The total number of variations Mtot is dependent on the number Nr of runs of minimal length in the composed sequence, according to the relation Mtot=2Nr+3

By way of example, the 7 possible variations (including the original sequence) for the sequence of bits 12 to 19 are shown in FIG. 10.

In this embodiment the variations are restricted to the composed sequence, and those sequences which can be obtained therefrom without changing the number of unipolar sequences. For example the sequence shown in FIG. 10h is not included, as it is highly unlikely that this sequence will correspond to the input signal $A_i$.

The number of variations may be further reduced on the basis of the output signal α of tilt detector 31. In that case the set of sequences is restricted to the composed sequence, and the sequences which can be obtained by shifting one or more boundaries of the unipolar sequences in the original sequence in a first direction, or by shifting one or more of those boundaries in an opposite direction. In the present example either the sequences shown in FIGS. 10a–10d would be selected or the set including the original sequence (FIG. 10a) and the variations shown in FIGS. 10e to 10g. The sequences shown in FIGS. 10b–d or in FIGS. 10e–g can be obtained by shifting one or more boundaries of the unipolar sequences in the original sequence in a first direction, or by shifting one or more of those boundaries in an opposite direction.

As the value of M(=1) is less than the value of Mtot, the program continues with execution of PP11. This has the effect that the modifier 84 generates the next modification in the current variation register 78. The program continues with PP2 and then repeats the loop PP3-PP4 until the distance D has been calculated for that variation. As M equals 1 for this variation the program continues after the test PP5 with the test PP8. In PP8 it is tested whether the distance D calculated for that variation is less than the minimal distance Dmin stored in register 98. If this is true, then the minimal distance Dmin is set equal to the distance D in PP6, and the content of the current variation register 78 is copied to the best variation register 80 in PP7. The comparison PP8 is performed by comparator 100.

The program continues until all variations have been generated and the minimal distance Dmin is determined.

FIG. 11 shows a tilt detector 31 which can be used in the unit shown in FIG. 6 to generate a signal a indicating the direction of tilt. The tilt detector 31 comprises a delay line with delay elements 110a–d, which is connected to a first input 108 for receiving the final binary signal $B_i^o$. The input 108 and the outputs of the delay elements 110a–d are coupled to a first and a second pattern detector. The first detector 112 generates a detection signal S1 in response to the pattern 10000. The second detector 114 generates a detection signal S2 in response to the pattern 00001. In another embodiment the patterns are 01111 and 11110 respectively. In response to the signal S1 the sample and hold register 116 samples the corresponding amplitude value $A_i$ which it receives via a delay line 120 from the input 122. Likewise the sample and hold register 118 samples the corresponding amplitude value $A_i$ which it receives via a delay line 120 from the input 122 in response to the signal S2. The values sampled by registers 118 and 116 respectively are averaged by averagers 124 and 126 respectively. The output signals of these averagers 124, 126 are subtracted from each other by subtractor 128, so as to generate the signal α.

A first (I) and a second embodiment (II) of the detector of the invention were compared with a first (i), a second (ii) and a third detector (iii) not according to the invention.

The first detector (i) not according to the invention is a threshold detector. The second detector (ii) not according to the invention is a combination of a threshold detector and a runlength pushback detector. The third detector (iii) not according to the invention is an adaptive Viterbi detector with a 5-tap response. The Viterbi detector is based on a trellis diagram consisting of 12 states.

The second embodiment (II) of the detector according to the invention is the same as described with reference to FIG. 6. In that embodiment the set which is evaluated is restricted to those sequences which can be obtained by changing the polarity of at most one of the first neighboring bit and the second neighboring bit, depending on the direction of tilt which is estimated.

The first embodiment (I) of the detector differs therefrom in that a tilt detector 31 is lacking. In that embodiment the set is evaluated which comprises the composed sequence and that the set is restricted to the composed sequence, such that the composed sequence comprises one first neighboring bit and one second neighboring bit, and those sequences which can be obtained from the composed sequence without changing the number of unipolar sequences.

The functioning of the five detectors was tested by means of test information stored at a DVD-ROM disk. The test information was encoded in the form of a channel code having a minimum runlength of 3 and stored at the disk with a laser having a wavelength of 650 nm. The track pitch amounted 0.74 μm and the linear density was 4.6% higher than specified in the DVD-standard. To test the robustness of the detectors at varying degrees of distortion, the tangential disk tilt was varied between −0.80° and +0.80°. It was determined within which tilt margin the Symbol Error Rate (SER) was less or equal than $10^{-4}$. The results are shown in the following table.

| Detector | tilt margin (°) | improvement |
|---|---|---|
| i | 0.8135 | |
| ii | 1.0305 | |
| iii | 1.2980 | 26.0% |
| I | 1.2612 | 22.4% |
| II | 1.3146 | 27.6% |

As expected the Viterbi detector (iii) allows a higher tilt margin (+26.0%) than the runlength pushback detector (ii). Surprisingly the first embodiment of the detector according to the invention (I) provides in an improvement of the tilt margin (+22.4%) which is comparable to that obtained with the Viterbi-detector, while the number of possible bit sequences which it evaluates is significantly less. Even more surprising is that the second embodiment of the detector according to the invention (II) provides in an improvement of the tilt margin (27.6%) which is even higher than that obtained by the Viterbi detector, while the number of bit sequences which is evaluated is about half that evaluated by the detector according to embodiment I of the invention.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. Detector (30) for detecting a digital signal ($B_i^o$) out of an input information signal ($A_i$) which represents a runlength limited sequence, the runlength having a minimal value m, the detector (30) comprising, means (60, 62) for generating a preliminary binary signal ($B_i$) out of said input information signal ($A_i$), means (86) for identifying a composed sequence of subsequent bits within the preliminary binary signal ($B_i$) which subsequently comprises at least a first neighboring bit of a unipolar sequence of length greater or equal than m+1, one or more further unipolar sequences of length m and at least a second neighboring bit of a unipolar sequence of length greater or equal than m+1, a unipolar sequence being defined as a sequence of bits having the same binary value, and bordering at both sides at a bit having the opposite binary value, means (84, 86) for generating a set of sequences which can be obtained from said composed sequence by changing polarities of binary values within said composed sequence without violating the runlength constraint, the set comprising the composed sequence obtained from the preliminary binary signal, means (94, 96) for calculating a path metric (D) for two or more sequences of said set, said path metric (D) being the sum of the branch metrics (d) for the path through the trellis corresponding to said sequence of binary values, means (86, 98, 100) for identifying the sequence from said set which has the highest likelihood of correspondence to the input sequence represented by the input information signal ($A_i$) on the basis of the path metric.

2. Detector according to claim 1, characterized in that the composed sequence comprises one first neighboring bit and one second neighboring bit.

3. Detector according to claim 1 or 2, characterized in that the set is restricted to the composed sequence (FIG. 10a), and those sequences (FIG. 10b–FIG. 10g) which can be obtained from the composed sequence without changing the number of unipolar sequences.

4. Reproduction system (20) for reproducing digital symbols stored on a medium (22), said reproduction system (20) comprising read out means (26) which include means for projecting a first optical beam (24) along an optical axis (34) at a scanning spot (36) at the medium and for generating an input information signal ($A_i$) representing the digital symbols stored on the medium (22), by measuring an intensity of an optical beam returned from the scanning spot (36), said reproduction system (20) further comprising movement means (38, 42, 44, 46) for causing a relative movement in a movement direction (v) between the scanning spot (36) and the medium (22), said reproduction system (20) further comprising a detector (30) according to claim 3 for deriving a digital signal ($B_i^o$) from said input information signal ($A_i$).

5. Reproduction system according to claim 4, characterized by tilt detection means (31) for generating a tilt signal (cc) which is indicative for the polarity of a deviation between the optical axis (34) and a normal vector (40) of the medium (22) with respect to the movement direction (v), and means for restricting the set of sequences for which the path metric is determined on the basis of the tilt signal (α).

6. Reproduction system according to claim 5, characterized in that the tilt detection means (31) comprise means (112, 114) for detecting first symbol patterns of the form xxxxo and second symbol patterns of the form oxxxx, wherein o and x respectively represent a first and a second polarity, means (124, 126) for measuring the average amplitude level in the input information signal ($A_i$) corresponding to the first and to the second bit pattern.

7. Reproduction system according to claim 6, characterized by means for restricting the set to those sequences which can be obtained by changing the polarity of at most one of the first neighboring bit (FIGS. 10a–d) and the second neighboring bit (FIG. 10a, FIGS. 10e–g), depending on the direction of tilt which is estimated.

8. Detector according to claim 1, characterized in that the set is restricted to the composed sequence (FIG. 10a), and the sequences (FIGS. 10b–d; FIGS. 10e–g) which can be obtained by shifting one or more boundaries of the unipolar sequences in the original sequence in a first direction, or by shifting one or more of those boundaries in an opposite direction.

9. Receiver (10) for reproducing a sequence of output symbols from a received signal, the receiver comprising a detector (16) according to claim 8, which is coupled to a demodulator (12) for demodulating the received signal.

10. Receiver (10) according to claim 9, characterized in that the detector (16) is coupled to the demodulator (12) via an equalizer (14).

11. Reproduction system (20) for reproducing digital symbols stored on a medium (22), said reproduction system (20) comprising read out means (26) which include means for projecting a first optical beam (24) along an optical axis (34) at a scanning spot (36) at the medium and for generating an input information signal ($A_i$) representing the digital symbols stored on the medium (22), by measuring an intensity of an optical beam returned from the scanning spot (36), said reproduction system (20) further comprising movement means (38, 42, 44, 46) for causing a relative movement in a movement direction (v) between the scanning spot (36) and the medium (22), said reproduction system (20) further comprising a detector (30) according to claim 1 or 2 for deriving a digital signal ($B_i^o$) from said input information signal ($A_i$).

12. Reproduction system according to claim 11, characterized by tilt detection means (31) for generating a tilt signal ($\alpha$) which is indicative for the polarity of a deviation between the optical axis (34) and a normal vector (40) of the medium (22) with respect to the movement direction (v), and means for restricting the set of sequences for which the path metric is determined on the basis of the tilt signal ($\alpha$).

13. Reproduction system according to claim 12, characterized in that the tilt detection means (31) comprise means (112, 114) for detecting first symbol patterns of the form xxxxo and second symbol patterns of the form oxxxx, wherein o and x respectively represent a first and a second polarity, means (124, 126) for measuring the average amplitude level in the input information signal ($A_i$) corresponding to the first and to the second bit pattern.

14. Reproduction system according to claim 13, characterized by means for restricting the set to those sequences which can be obtained by changing the polarity of at most one of the first neighboring bit (FIGS. 10a–d) and the second neighboring bit (FIG. 10a, FIGS. 10e–g), depending on the direction of tilt which is estimated.

15. Receiver (10) for reproducing a sequence of output symbols from a received signal, the receiver comprising a detector (16) according to one of the claims 1, 2, or 8 which is coupled to a demodulator (12) for demodulating the received signal.

16. Receiver (10) according to claim 15, characterized in that the detector (16) is coupled to the demodulator (12) via an equalizer (14).

17. Method for detecting a binary signal ($B_i^o$) out of an input information signal ($A_i$) which represents a runlength limited sequence, the runlength having a minimal value m, the method comprising the steps of generating a preliminary binary signal ($B_i$) out of said input information signal ($A_i$), identifying a composed sequence of subsequent bits (FIG. 10a) within the binary signal which subsequently comprises at least a first neighboring bit of a unipolar sequence of length greater or equal than m+1, one or more further unipolar sequences of length m and at least a second neighboring bit of a unipolar sequence of length greater or equal than m+1, a unipolar sequence being defined as a sequence of bits having the same binary value, and bordering at both sides at a bit having the opposite binary value (FIG. 7), generating a set of sequences (FIGS. 10a–g) which can be obtained from said composed sequence by changing polarities of binary values within said composed sequence without violating the runlength constraint, the set comprising the composed sequence (PP11) obtained from the preliminary binary signal, calculating a path metric (PP3) for two or more sequences of said set, said path metric being the sum of the branch metrics for the path through the trellis corresponding to said sequence of binary values, identifying the sequence from said set which has the highest likelihood of corresponding to the input sequence represented by the input information signal on the basis of the path metric (PP7).

* * * * *